United States Patent
Chang et al.

(10) Patent No.: US 6,563,145 B1
(45) Date of Patent: May 13, 2003

(54) METHODS AND APPARATUS FOR A COMPOSITE COLLECTOR DOUBLE HETEROJUNCTION BIPOLAR TRANSISTOR

(76) Inventors: Charles E. Chang, 1800 Golden Oak, Newbury Park, CA (US) 91320; Richard L. Pierson, 935 Callado, Thousand Oaks, CA (US) 91360; Peter J. Zampardi, 1691 Margate Pl., Westlake Village, CA (US) 91361; Peter M. Asbeck, 4840 Tarantella La., San Diego, CA (US) 92130

( * ) Notice: Subject to any disclaimer, the term of this patent is extended or adjusted under 35 U.S.C. 154(b) by 0 days.

(21) Appl. No.: 09/474,624

(22) Filed: Dec. 29, 1999

Related U.S. Application Data

(60) Provisional application No. 60/130,072, filed on Apr. 19, 1999.

(51) Int. Cl.[7] .............................................. H01L 29/739
(52) U.S. Cl. ........................ 257/197; 257/200; 438/35; 438/235; 438/342; 438/796
(58) Field of Search ................. 257/197, 198, 257/200; 438/235, 796, 342, 35, 313, 317

(56) References Cited

U.S. PATENT DOCUMENTS

| | | | |
|---|---|---|---|
| 4,996,166 A | * 2/1991 | Ohshima ..................... 438/317 |
| 5,170,407 A | * 12/1992 | Schubert et al. ............. 372/45 |
| 5,213,987 A | * 5/1993 | Bayraktaroglu ............. 438/170 |
| 5,242,843 A | * 9/1993 | Aina ........................... 438/319 |
| 5,401,999 A | * 3/1995 | Bayraktaroglu ............. 257/189 |
| 5,552,617 A | * 9/1996 | Hill et al. .................... 257/197 |
| 5,606,185 A | * 2/1997 | Nguyen et al. ............. 257/191 |
| 5,753,545 A | * 5/1998 | Liu et al. ..................... 438/172 |
| 5,756,375 A | * 5/1998 | Celii et al. ................... 438/495 |
| 5,757,039 A | * 5/1998 | Delaney et al. ............. 257/191 |
| 5,780,880 A | * 7/1998 | Enquist ....................... 257/188 |
| 5,789,535 A | * 8/1998 | Arts et al. .................... 34/368 |
| 5,837,589 A | * 11/1998 | McNamara et al. ........ 438/314 |
| 6,043,520 A | * 3/2000 | Yamamoto et al. ......... 257/197 |
| 6,133,594 A | * 10/2000 | Iwai et al. ................... 257/198 |
| 6,147,371 A | * 11/2000 | Tanaka ........................ 257/197 |
| 6,326,650 B1 | * 12/2001 | Allam .......................... 257/18 |
| 6,399,969 B1 | * 6/2002 | Twynam ...................... 257/190 |

OTHER PUBLICATIONS

W. Liu and D.S. Pan, "A Proposed Collector Design of Double Heterojunction Bipolar Transistors for Power Applications," IEEE Electron Device Letters, vol. 16, No. 7, Jul. 1995, pp. 309–311.

* cited by examiner

Primary Examiner—Olik Chaudhuri
Assistant Examiner—Fernando Toledo

(57) ABSTRACT

A compound collector double heterojunction bipolar transistor (CCHBT) incorporates a collector comprising two layers: a wide bandgap collector region (e.g., GaAs), and a narrow bandgap collector region (e.g., InGaP). The higher electric field is supported in the wide bandgap region, thereby increasing breakdown voltage and reducing offset voltage. At the same time, the use of wide bandgap material in the depleted portion of the collector, and a higher mobility material toward the end and outside of the depletion region, reduces series resistance as well as knee voltage.

11 Claims, 4 Drawing Sheets

HOMOJUNCTION

SHBT

DHBT

PRIOR ART

METHODS AND APPARATUS FOR A COMPOSITE COLLECTOR DOUBLE HETEROJUNCTION BIPOLAR TRANSISTOR

CROSS-REFERENCE TO RELATED APPLICATIONS

This application claims the benefit of U.S. Provisional Application Serial No. 60/130,072, filed Apr. 19, 1999, hereby incorporated by reference.

BACKGROUND OF THE INVENTION

1. Technical Field

The present invention relates, generally, to semiconductor devices and, more particularly, to an improved heterojunction bipolar transistor incorporating a compound collector structure.

2. Background Information

In contrast to a standard homojunction transistor, a heterojunction bipolar transistor (HBT) includes at least two dissimilar semiconductor materials. That is, referring now to FIGS. 1A and 1B, while the emitter 102, base 104, and collector 106 of a standard homojunction transistor are formed from the same semiconductor material (e.g., Si or GaAs), in a single heterojunction bipolar transistor (SHBT), the emitter 108 is formed from a wide bandgap material, and the base 104 is formed from a narrow bandgap material. For example, among the III-V compounds, $Al_xGa_{1-x}As$ (AlGaAs) may be used for the wide bandgap material, and a ternary compound such as GaAs may be used for the narrow bandgap material.

Among other things, HBTs can achieve large gain values even in cases where the base doping level is relatively high, allowing low base resistance. This attribute is particularly advantageous in high-frequency, wireless and microwave applications.

Another type of HBT, the double heterojunction bipolar transistor (DHBT) has achieved wide popularity in high-speed applications such as RF power amplifiers, high-speed digital communication circuits, and the like. A typical DHBT, as shown in FIG. 1C, incorporates a wide bandgap material for both the emitter 108 and collector 110, and another type of semiconductor, e.g., a narrow bandgap material, for the base 104. It is generally assumed that some sort of composition grading or delta-doping can be used between the junctions to smooth out bandgap conduction or valence band discontinuities. With reference to the base-emitter depletion region 120, and the collector-base depletion region 122 as illustrated in the Figures, it is also assumed that the wide bandgap material can make a transition to the narrow region at a sufficient distance away from the active junction depletion region.

While the DHBT configuration offers higher breakdown voltage and lower offset voltages as compared to SHBTs, known DHBTs are unsatisfactory in a number of respects. For example, such devices often exhibit high knee voltages. The knee voltage, referring momentarily to FIG. 4A, is the point (408) at which $I_C$ becomes substantially constant on the $V_{CE}$-$I_C$ curve (transition between the linear and saturation regions).

In DHBTs, the wider bandgap in the collector is desirable as it offers higher breakdown voltage—a characteristic important in power amplifiers designs. As the base-emitter turn-on voltage is similar to the base-collector characteristic (both are heterojunctions), the offset voltage 407 is lower. Both the offset and series collector resistance affect the location of the knee voltage. In power amplifiers, the point at which the dynamic load line intersects the knee effectively sets the efficiency of the amplifier. Hence, a smaller knee voltage offers higher efficiency. More particularly, a low knee voltage permits high-efficiency power amplification at lower voltages.

Another important contributor to knee voltage is the collector series resistance, which in typical DHBTs is high due to the lower electron mobility in the wide bandgap material. Devices with high knee voltage tend to be less efficient, particularly at low power supply voltages. Furthermore, suitable collector materials used in DHBTs that have a higher range of breakdown voltages typically exhibit high collector on-resistance due to low mobility.

Methods are therefore needed in order to overcome these and other limitations of the prior art.

BRIEF SUMMARY OF THE INVENTION

The present invention provides systems and methods which overcome the shortcomings of the prior art. In accordance with one embodiment of the present invention, a composite collector double heterojunction bipolar transistor (CCHBT) incorporates a collector comprising two layers: a wide bandgap collector region (e.g., GaAs), and a narrow bandgap collector region (e.g., InGaP).

In accordance with one aspect of the present invention, the higher electric field is supported in the region comprising high breakdown material—e.g., in the wide bandgap region—thereby increasing breakdown voltage.

In accordance with another aspect of the present invention, the use of heterojunctions for the base-emitter and base-collector junctions having comparable turn-on voltages results in lower offset voltage.

In accordance with yet another aspect of the present invention, the use of the wide bandgap, high breakdown material whose thickness is less than or equal to the depletion region of the collector, followed by a narrow, high-mobility material in the remaining depletion region, reduces series resistance as well as knee voltage.

BRIEF DESCRIPTION OF THE SEVERAL VIEWS OF THE DRAWINGS

The subject invention will hereinafter be described in conjunction with the appended drawing figures, wherein like numerals denote like elements, and.

DETAILED DESCRIPTION OF PREFERRED EXEMPLARY EMBODIMENTS

Systems and methods in accordance with various aspects of the present invention provide a composite collector double heterojunction bipolar transistor (CCHBT) which incorporates a first material in the area of highest electric field, and a second material for the rest of the collector, wherein the first material can support high electric fields and has low mobility, and the second material exhibits high mobility (e.g., less resistance) but may not support high fields. In a preferred embodiment, as set forth below, the first material comprises a wide bandgap semiconductor, and the second material comprises a narrow bandgap semiconductor. In this way, breakdown voltage is increased and, at the same time, knee-voltage, and offset voltage are reduced. By way of contrast, in known DHBTs, the wide-to-narrow bandgap material transition occurs a significant distance from the active collector region (outside the depletion region), and therefore suffers from many of the limitations addressed by the present invention.

Figure 1A:
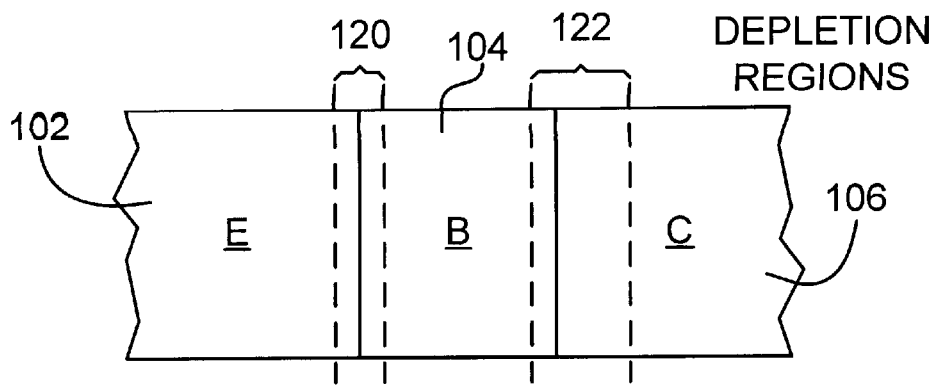
FIGS. 1A–1C depict schematic cross-section views of typical prior art homojunction, heterojunction, and double-heterojunction bipolar transistor devices.
Figure 1B:
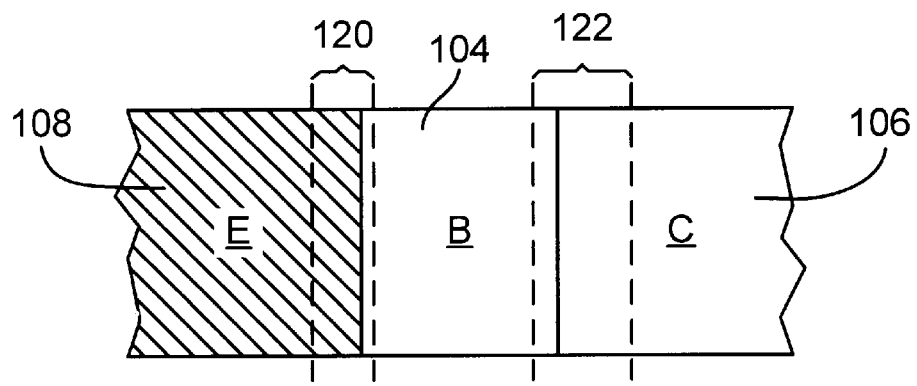
Figure 1C:
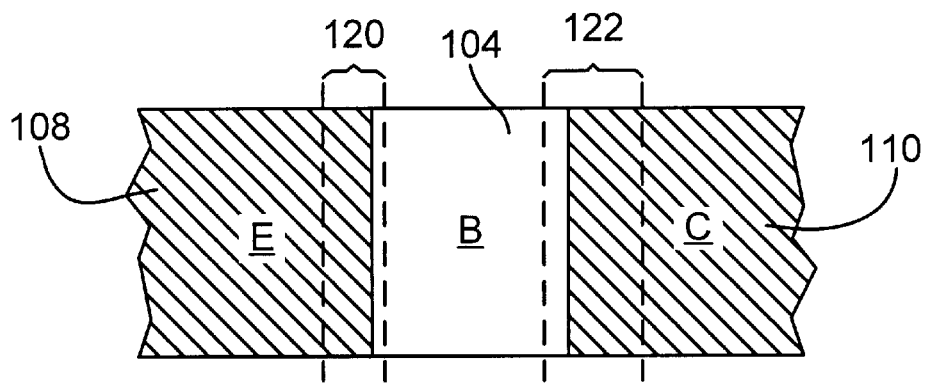
Figure 2:
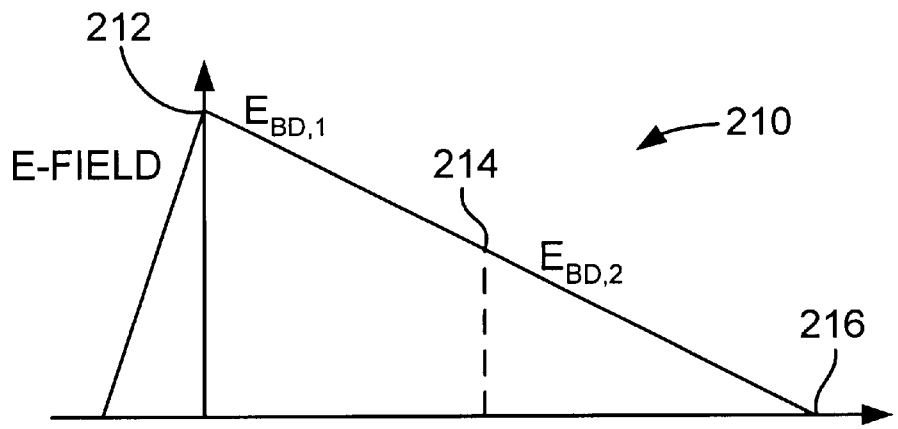
FIG. 2 is schematic cross-section view of a CCHBT and associated electrical field distribution in accordance with the present invention.
Figure 2:
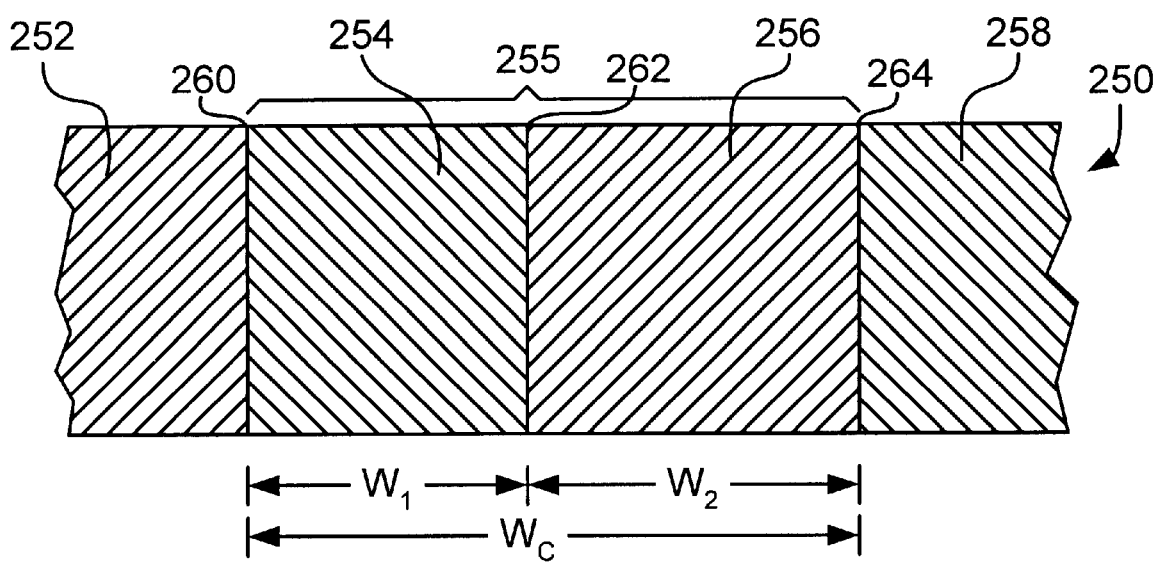

Referring to FIG. 2, a CCHBT 250 in accordance with the present invention generally comprises a compound collector region 255 situated between the base, 252 and the sub-collector 258. Compound collector 255 generally comprises a wide bandgap region 254 of width W1, and a narrow bandgap region 256 of width W2, wherein the total width of compound collector 255 is WC. These widths are preferably chosen such that the depletion region, which can be calculated and/or modeled using convention techniques, extends to, or past, the width of region 254, and ends between interfaces 262 and 264. That is, first material region 254 is preferably selected to be less than or nearly equal to the width of the depletion region.

The width of the depletion region can be computed in accordance with conventional space-charge region approximations. That is, a depletion width can be calculated based on the impurity concentrations and bandgaps of the semiconductor materials and the type of junction (i.e., step or graded). Typically, grading, or other delta-doping, is introduced to reduce conduction band offsets in NPN DHBT transistors in between the base-emitter and base-collector junctions. See, for example, Grove, Physics and Technology of Semiconductor Devices (1967), pp 156–159. Due to the complicated nature of charge injected into the base-collector depletion region, a 2-D or 3-D numerical simulation is typically used in order to model the depletion region. Such numeric modeling methods are conventional and well known in the art.

Graph 210 in FIG. 2 depicts, qualitatively, the electrical field distribution within compound collector 255 and base 252 under reverse bias conditions. As shown, the field reaches a maximum (212) at the interface of base 252 and wide bandgap region 254, and a minimum (216) at the interface 264 of narrow bandgap region 256 and sub-collector 258.

Thus, the higher field is supported by first material 254, resulting in higher breakdown voltage. At the same time, the use of higher mobility material for second material 254 helps to reduce series resistance as well as the knee voltage. In this regard, it is desirable that the width of wide bandgap region 254 be thick enough to support the high fields until second material 254 can support the field. This typically requires that the width of first material 254 be less than the width of the depletion region. To minimize series resistance, region 254 preferably terminates at the point at which material 256 can support the e-field.

With continued reference to FIG. 2, $E_{BD,1}$ is the maximum breakdown field within wide bandgap region 254, and $E_{BD,2}$ is the maximum breakdown field within narrow bandgap region 256. If a linear field distribution is assumed, the field strengths and collector widths are, in an optimally configured system, given by:

$$\frac{E_{BD,1}}{E_{BD,2}} = \frac{W_C}{W_2}$$

Thus, given a predetermined width $W_c$ and a known depletion region width, and assuming that the breakdown fields, $E_{BD,1}$ and $E_{BD,2}$ are equal to the maximum breakdown fields sustainable by the materials used for regions 254 and 256, the optimum width of narrow bandgap region 256 is given by:

$$W_1 = \left(1 - \frac{E_{BD,2}}{E_{BD,1}}\right) W_C$$

For example, consider the case where wide bandgap material 254 comprises GaInP, and narrow bandgap material 256 comprises GaAs. In such a case, at nominal dopant levels, $E_{BD,1}$=660 KV/cm, and $E_{BD,2}$=400 KV/cm, assuming a total collector width ($W_C$) of 7000 Å, the width $W_1$ of wide bandgap region 254 is then preferably about 3125 Å, and the width $W_2$ of narrow bandgap region 256 is preferably about 3875 Å. For additional information regarding breakdown field values, see, e.g., Q. Hartmann, "Effect of Collector Design on the DC Characteristics of In0.49Ga0.51P/GaAs Heterojunction Bipolar Transistors," Solid-State Electronics, Vol. 38, No. 12, pp. 2017–2021, 1995.

As is known, wide bandgap materials generally exhibit higher breakdown fields than narrow bandgap materials. This being the case, however, it is also desirable to reduce the on resistance ($R_{on}$) through the use of materials with high mobility ($\mu$), which typically favor low bandgap materials.

Figure 3:
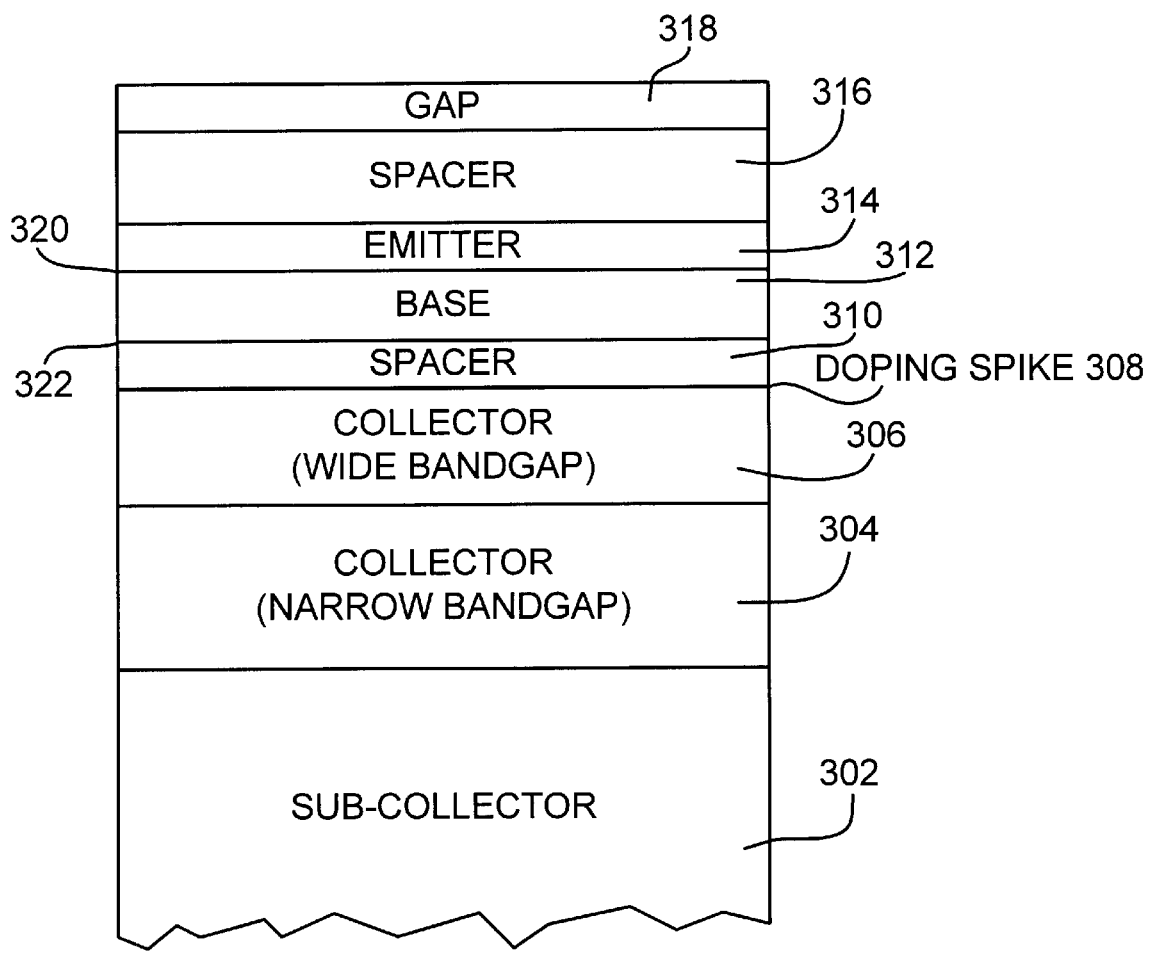
FIG. 3 is schematic cross-section vie of a CCHBT in accordance with one embodiment of the present invention.

Accordingly, FIG. 3 depicts a schematic cross-sectional view of one embodiment of the present invention configured using III–V materials. In general, the illustrated CCHBT comprises a sub-collector 302, a narrow band gap collector region 304, a wide bandgap collector region 306, a doping spike 308, a spacer 310, a base region 312, an emitter region 314, a second spacer region 316, and a cap 318.

Sub-collector 302 comprises any of a variety of semiconductor materials suitable for use as the transistor's collector. In one embodiment, Sub-collector 302 comprises n-type GaAs having a concentration of about $5 \times 10^{18}$ cm$^{-3}$ and a thickness of about 10000 Å. In alternative embodiments, the transition between the wide and narrow bandgap materials occurs within the sub-collector.

Collector 304 and collector 306 are configured in accordance with the guidelines described above with respect to breakdown field voltages and layer thicknesses. Collector 304 comprises a semiconductor material with a suitably narrow bandgap. In the illustrated embodiment, narrow bandgap collector 304 comprises n-type GaAs having a concentration of about 3E16 cm$^{-3}$ and a thickness of about 4000 Å.

Collector 306 comprises a semiconductor material with a suitably wide bandgap. In one embodiment, collector 306 comprises n-type InGaP having a concentration of about 3E16 cm$^{-3}$ and a thickness of about 2650 Å.

Doping spike 308 comprises a thin region of material having a relatively high doping concentration with respect to layers 306 and 310. In this regard, doping spike 308 functions to smooth the heterojunction notch at the base/collector interface. In one embodiment, doping spike 308 consists of an n-type InGaP implantation approximately 50 Å thick having a concentration of about 2E18 cm$^{-3}$. Working in conjunction with doping spike 308, spacer 310 also serves to smooth the transition from collector 306 to base 312. In one embodiment, spacer 310 comprises n-type GaAs with a thickness of about 300 Å and a concentration of about 3E16 $cm^{-3}$.

This transition may be performed using a number of methods, including use of a set back and doping spike as described above, or using composition grading. See, e.g., W. Liu and D. S. Pan, "A Proposed Collector Design of Double Heterojunction Bipolar Transistors for Power Applications," IEEE Electron Device Letters, Vol 16, No. 7, July 1995, which is hereby incorporated by reference.

In addition to the use of doping spikes and spacers, other methods may be used to smooth the transition from low bandgap to high bandgap materials. See, e.g., Liu et al, *A Proposed Collector Design of Double Heterojunction Bipolar Transistors for Power Applications*, IEEE Electron Device Letters, Vol. 16, No. 7 July 1995, which sets forth a composition grading scheme.

Base layer 312 comprises a semiconductor having a substantially different bandgap from that used for emitter layer 314. In one embodiment, base 312 comprises p-type GaAs having a concentrations of about 4E19 $cm^{-3}$ and a thickness of about 1200 Å.

Emitter layer 314 functions as the emitter of the CCHBT transistor emitter in the conventional manner. In one embodiment, emitter layer 314 comprises n-type AlGaAs having a thickness of about 350 Å and a concentration of about 3E17 $cm^{-3}$. In one embodiment, spacer 316 comprises n-type GaAs with a concentration of about 8E18 and a thickness of about 1200 Å.

Cap layer 318 serves to reduce the emitter resistance to the contact material (not shown in the Figure). In the illustrated embodiment, cap 318 comprises a layer of n-type InGaAs having a concentration of about 1E19 and a thickness of about 600 Å. It will be appreciated that a variety of cap layers materials may be used depending on emitter type and contact material.

Figure 4A:
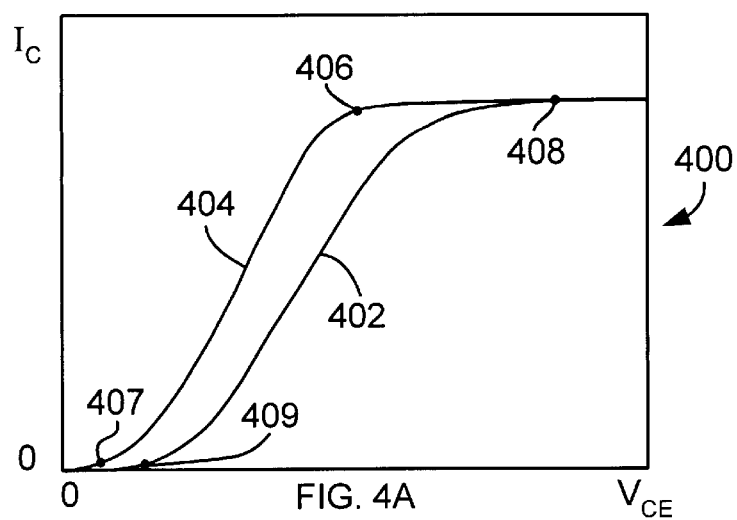
FIGS. 4A–4C are current-voltage waveforms illustrating various advantages of systems in accordance with the present invention.

FIG. 4A depicts qualitatively a current-voltage waveform comparing on-characteristics of a baseline SHBT device (curve 402) and a CCHBT manufactured in accordance with one embodiment of the present invention. As is shown, the knee voltage of the CCHBT (point 406) is less than that of the SHBT (point 408). At the same time, the offset voltage (409) is substantially reduced. Indeed, experimental testing has shown approximately a 200 mV reduction in knee voltage between CCHBTs manufactured in accordance with the present invention and standard AlGaAs HBTs with the same collector length.

Figure 4B:
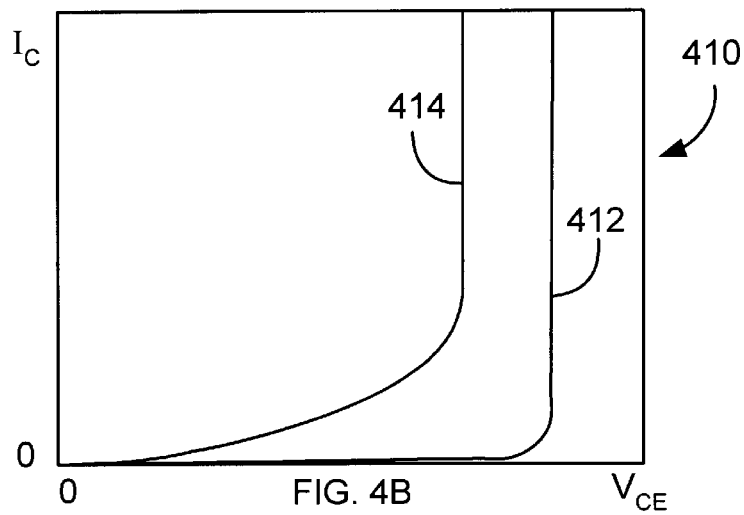
Figure 4C:
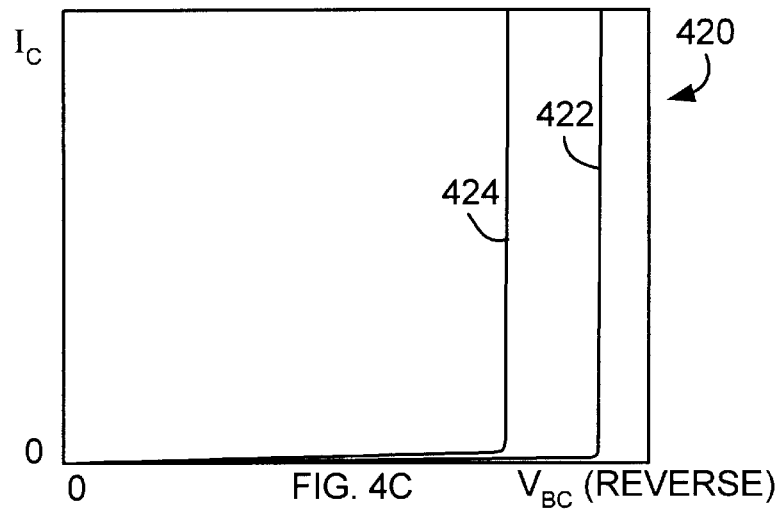

FIG. 4B, which shows a qualitative current-voltage waveform for a baseline SHBT device (curve 414) and a CCHBT manufactured in accordance with the present invention. As depicted, the breakdown voltage (412) for the CCHBT is substantially higher than that exhibited by a comparable SHBT device (414). Testing has shown approximately a 20% improvement in breakdown voltage. Similarly, as shown in FIG. 4C, the reverse collector-base characteristic shows a comparable improvement in breakdown voltage.

CCHBT layers may be suitably formed from a variety of semiconductor grown, deposition, and implant methods. For III–V materials, the most popular techniques include chemical vapor deposition (CVD) and/or molecular beam epitaxy (MBE). Further information regarding exemplary semiconductor processing methods applicable to the current invention, see, e.g., M. F. Chang et al., "III–V Heterojunction Bipolar Transistors for High-Speed Applications," International Journal of High Speed Electronics, Vol. 1, Nos. 3 & 4, pp 245–301. This document is hereby incorporated by reference.

Although the invention has been described herein in conjunction with the appended drawings, those skilled in the art will appreciate that the scope of the invention is not so limited. For example, while the present invention has been described in the context of GaAs/InGaP structures other combinations of semiconductor materials may also be used, for example: GaAs/AlGaAs, InP/InGaP, GaAs/InGaAs and other group III–V semiconductors; SiGe, SiC, GeC; and group II–VI materials. These and other modifications in the selection, design, and arrangement of the various components and steps discussed herein may be made without departing from the scope of the invention as set forth in the appended claims.

What is claimed is:

1. A heterojunction bipolar transistor comprising:

a sub-collector;

a collector, including a wide bandgap semiconductor material, having a thickness and a breakdown field, and a narrow bandgap semiconductor material, having a breakdown field, such that said wide bandgap material is in contact with said narrow bandgap material and such that said breakdown field of said wide bandgap material is greater than said breakdown field of said narrow bandgap material;

a base;

a base-collector depletion region being associated therewith, wherein said thickness of said wide bandgap-material is less than the depletion region;

a transition region provided between said wide bandgap material and said base to smooth the transition between said collector and said base;

an emitter;

a spacer provided on said emitter; and a cap layer.

2. The heterojunction bipolar transistor of claim 1, wherein said narrow bandgap material has a higher mobility than that of said wide bandgap material.

3. The heterojunction bipolar transistor of claim 1, wherein said wide bandgap material is fully depleted, and said narrow bandgap material is partially depleted.

4. The heterojunction bipolar transistor of claim 1, wherein said wide bandgap material and said narrow bandgap material comprise group III–V semiconductors.

5. The heterojunction bipolar transistor of claim 1, wherein said wide bandgap material and said narrow bandgap material are selected from the group consisting of group IV and group II–VI semiconductors.

6. The heterojunction bipolar transistor of claim 3, wherein said wide bandgap material comprises InGaP, and said narrow bandgap material comprises GaAs.

7. The heterojunction bipolar transistor of claim 3, wherein said wide bandgap material has a thickness of about 2650 angstroms, said narrow bandgap material has a thickness of about 4000 angstroms, and the depletion region is greater than about 2650 angstroms.

8. The heterojunction bipolar transistor of claim 1, wherein said transition region further comprises:

a spacer; and a doping spike.

9. The heterojunction bipolar transistor of claim 1, wherein said cap layer comprises InGaAs.

10. The heterojunction bipolar transistor of claim 1, wherein said sub-collector comprises GaAs.

11. The heterojunction bipolar transistor of claim 1, wherein said transition region spacer and said emitter spacer comprise GaAs.

* * * * *